United States Patent
Batson et al.

(10) Patent No.: US 6,760,881 B2
(45) Date of Patent: Jul. 6, 2004

(54) METHOD FOR COMBINING REFRESH OPERATION WITH PARITY VALIDATION IN A DRAM-BASED CONTENT ADDRESSABLE MEMORY (CAM)

(75) Inventors: Kevin A. Batson, Williston, VT (US); Robert E. Busch, Essex Junction, VT (US); Albert M. Chu, Essex, VT (US); Ezra D. B. Hall, Richmond, VT (US)

(73) Assignee: International Business Machines Corporation, Armonk, NY (US)

( * ) Notice: Subject to any disclaimer, the term of this patent is extended or adjusted under 35 U.S.C. 154(b) by 444 days.

(21) Appl. No.: 09/981,081

(22) Filed: Oct. 16, 2001

(65) Prior Publication Data

US 2003/0074630 A1 Apr. 17, 2003

(51) Int. Cl.[7] ............................................. G11C 29/00
(52) U.S. Cl. ..................... 714/773; 714/772; 714/767
(58) Field of Search ............................... 714/773, 772, 714/767

(56) References Cited

U.S. PATENT DOCUMENTS

| | | | |
|---|---|---|---|
| 4,183,096 A | 1/1980 | Cenker et al. | |
| 4,453,215 A | * 6/1984 | Reid | 714/11 |
| 4,682,328 A | 7/1987 | Ramsay et al. | |
| 4,780,845 A | 10/1988 | Threewitt | |
| 4,791,606 A | 12/1988 | Threewitt et al. | |
| 4,991,136 A | 2/1991 | Mihara | |
| 5,414,827 A | * 5/1995 | Lin | 711/135 |
| 5,642,320 A | 6/1997 | Jang | |
| 5,758,148 A | 5/1998 | Lipovski | |
| 5,777,608 A | 7/1998 | Lipovski et al. | |
| 5,887,272 A | 3/1999 | Sartore et al. | |
| 5,949,696 A | 9/1999 | Threewitt | |
| 6,026,465 A | 2/2000 | Mills et al. | |
| 6,067,656 A | 5/2000 | Rusu et al. | |
| 6,154,384 A | 11/2000 | Nataraj et al. | |
| 6,535,452 B2 | * 3/2003 | Okuda et al. | 365/230.03 |

* cited by examiner

Primary Examiner—Albert Decady
Assistant Examiner—Joseph D. Torres
(74) Attorney, Agent, or Firm—Steven Capella; Cantor Colburn LLP

(57) ABSTRACT

A method for combining a refresh operation with a parity validation for a DRAM-based content addressable memory (CAM) is disclosed. In an exemplary embodiment of the invention, the method includes implementing the memory refresh operation and examining a word included within the CAM. A determination is made as to whether data contained within the word constitutes valid data. If the data contained within the word does not constitute valid data, then the parity validation is bypassed. However, if the data contained within the word does constitute valid data, then the parity validation is implemented. The parity validation further includes reading the data contained within the word, generating a parity bit from the data contained within the word, and comparing the generated parity bit with a previously stored parity bit. If the parity validation is implemented and if the generated parity bit does not match the previously stored parity bit, then the data contained within the word is invalidated.

20 Claims, 4 Drawing Sheets

METHOD FOR COMBINING REFRESH OPERATION WITH PARITY VALIDATION IN A DRAM-BASED CONTENT ADDRESSABLE MEMORY (CAM)

BACKGROUND

The present invention relates generally to integrated circuit memory devices and, more particularly, to a method for combining a refresh operation with a parity check (and validation operation) in a DRAM-based content addressable memory (CAM).

A content addressable memory (CAM) is a storage device in which storage locations are identified by their contents, not by names or positions. A search argument is presented to the CAM and the location that matches the argument asserts a corresponding match line. One use for such a memory is in dynamically translating logical addresses to physical addresses in a virtual memory system. In this case, the logical address is the search argument and the physical address is produced as a result of the dynamic match line selecting the physical address from a storage location in a random access memory (RAM). CAMs are also frequently used for Internet address searching.

A conventional CAM includes an array of CAM cells, where each row of the CAM array corresponds to a stored word. The CAM cells in a row couple to a word line and a match line associated with the row. The word line connects to a control circuit that can either select the row for a read/write operation or bias the word line for a search. The match line carries a signal that, during a search, indicates whether the word stored in the row matches an applied input value. Each column of the conventional CAM array corresponds to the same bit position in all of the CAM words, while the CAM cells in a particular column are coupled to a pair of bit lines associated with the column. A search is applied to each pair of bit lines, which have a pair of complementary binary signals thereon that represent a bit of an input value. Each CAM cell changes the voltage on the associated match line if the CAM cell stores a bit that does not match the bit represented on the attached bit lines. Accordingly, if the voltage on a match line remains unchanged during a search, the word stored in that row of CAM cells matches the input word.

In a standard RAM, a parity check is typically performed during a normal read operation in order to detect "soft errors" that may occasionally occur during the storage or retrieval of binary information. A soft error may occur as a result of phenomena such as impacts of cosmic rays or alpha particles, wherein the value of a binary bit of stored data is changed. Generally speaking, a parity check is a technique in which a calculated parity bit associated with presently read data is compared with a previously stored parity bit that was generated during the original storage of a data word. A parity bit is the logical sum of all the data bits in a given word, and will either be "even" (i.e., "0") or "odd" (i.e., "1"). A soft error is thus detected if the parity of the data word does not match the original parity stored in the parity memory cell.

However, in a conventional CAM design, a parity check operation is not readily performed in conjunction with a CAM match operation, since the data bits stored in the CAM cells are not explicitly "read" by the control circuitry. Rather, input data is applied to the CAM cells for comparison, thereby either triggering a match or not. Thus, in a conventional CAM device, a parity check is performed in conjunction with a read operation which is apart from the normal CAM search operation. Unfortunately, the time associated with performing an additional read operation (solely for the purpose of checking parity) limits the throughput of the CAM search capability. Moreover, if the parity check operation results in bad parity, than an additional write cycle is then used to invalidate any entry that fails the parity check.

BRIEF SUMMARY

The above discussed and other drawbacks and deficiencies of the prior art are overcome or alleviated by a method for combining a refresh operation with a parity validation for a DRAM-based content addressable memory (CAM). In an exemplary embodiment of the invention, the method includes implementing the memory refresh operation and examining a word included within the CAM. A determination is made as to whether data contained within the word constitutes valid data. If the data contained within the word does not constitute valid data, then the parity validation is bypassed. However, if the data contained within the word does constitute valid data, then the parity validation is implemented. The parity validation further includes reading the data contained within the word, generating a parity bit from the data contained within the word, and comparing the generated parity bit with a previously stored parity bit. If the parity validation is implemented and if the generated parity bit does not match the previously stored parity bit, then the data contained within the word is invalidated.

In one embodiment, the DRAM-based content addressable memory (CAM) is of a binary configuration. The invalidating of the data contained within the word includes setting a data valid bit to a data invalid state, the data valid bit being associated with the word. The data valid bit may be implemented within a DRAM storage cell, the DRAM storage cell being in addition to data storage cells used to store the data. Preferably, the data valid bit is implemented within an SRAM storage cell, the SRAM storage cell being in addition to data storage cells used to store the data.

In an preferred embodiment, the DRAM-based content addressable memory (CAM) is of a ternary configuration. The invalidating of the data contained within the word includes setting one of a plurality of data storage cells used to store the data to a forced mismatch state.

BRIEF DESCRIPTION OF THE DRAWINGS

Referring to the exemplary drawings wherein like elements are numbered alike in the several Figures.

DETAILED DESCRIPTION

A CAM can be based on either SRAM (static) or DRAM (dynamic) storage cells. One example of a conventional SRAM cell includes a six-transistor cell, wherein two of the transistors are used as pass or access gates. The other four transistors are configured as cross-coupled CMOS inverters, thereby forming a stable latch for data storage. A data bit stored in an SRAM cell is stable, meaning that the contents therein need not be refreshed or rewritten to the cell over time. On the other hand, the number of devices used in an SRAM design places constraints on the packing density of each memory cell.

In contrast, a DRAM storage cell generally includes a single storage capacitor coupled with an access transistor. Having only two main components, the DRAM cell is smaller than an SRAM cell. However, the DRAM storage capacitor loses its charge over time. Thus, for any memory device having DRAM-based cells, whether a standard RAM or a CAM, the data stored in each cell must be refreshed.

Figure 1:
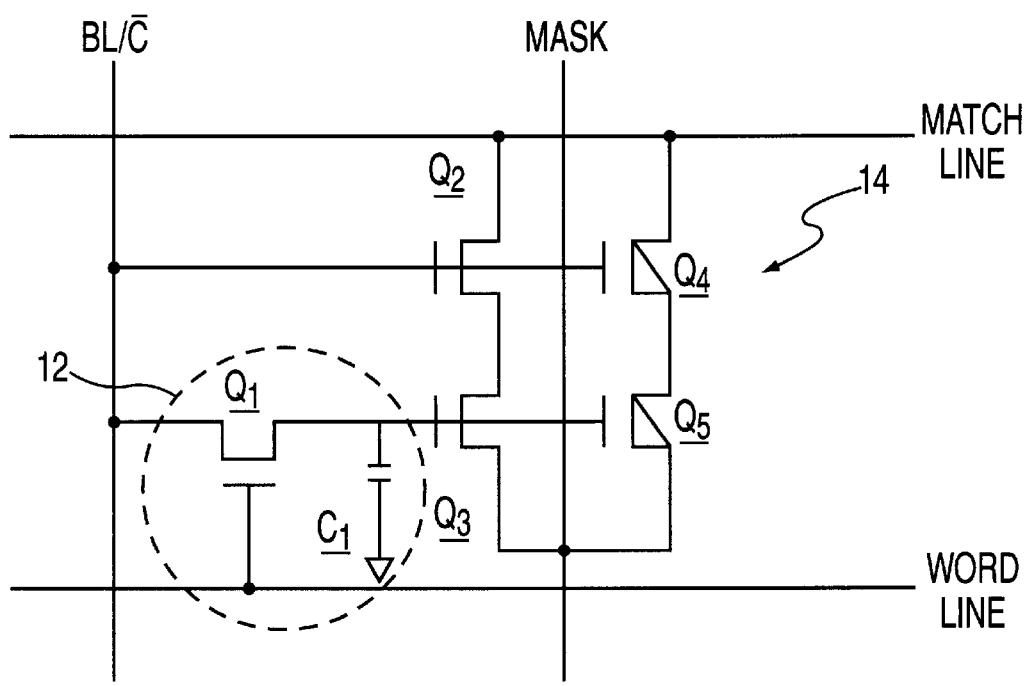
FIG. 1 is a schematic diagram of an existing DRAM-based, content addressable memory (CAM) cell.

Referring initially to FIG. 1, there is shown an example of an existing DRAM-based CAM cell 10. This cell, also referred to as a Dynamic CAM (DCAM) cell, is further described in U.S. Pat. No. 5,949,696 to Threewitt, the contents of which are incorporated herein by reference. Again the DCAM cell 10 is based on a one-capacitor, one-transistor storage element 12, including $C_1$ and $Q_1$. The comparison function of DCAM cell 10 is embodied by an exclusive-NOR (XNOR) element 14, including transistors $Q_2$, $Q_3$, $Q_4$ and $Q_5$, as well as an external load impedance applied on the match line. The specific operation of DCAM cell 10 is well known and is not described in greater detail. Generally speaking, however, a mismatch between an applied comparand data bit and the data stored in $C_1$ will cause a conductive path to be opened through either NFETS $Q_2$ and $Q_3$ or PFETS $Q_4$ and $Q_5$. Thereby, the mask line (biased to low during a non-global masking condition) will cause the match line to be pulled from high to low.

As stated earlier, because refreshing operations are a consequence of using DRAM based storage cells, a DRAM-based CAM (such as the one described above) will also be subject to a refreshing cycle. Therefore, rather than executing a parity check for a DRAM-based CAM during an additional read cycle, as methods heretofore have done, a parity validation may be implemented concurrently with the refresh operation. Thereby, the need for separate read and write cycles, solely for purposes of parity checking and entry invalidation, is eliminated. In the present context, "parity validation" refers to the combined operations of a parity check and, if bad parity is discovered, the subsequent invalidation of the bad data entry.

Figure 2A:
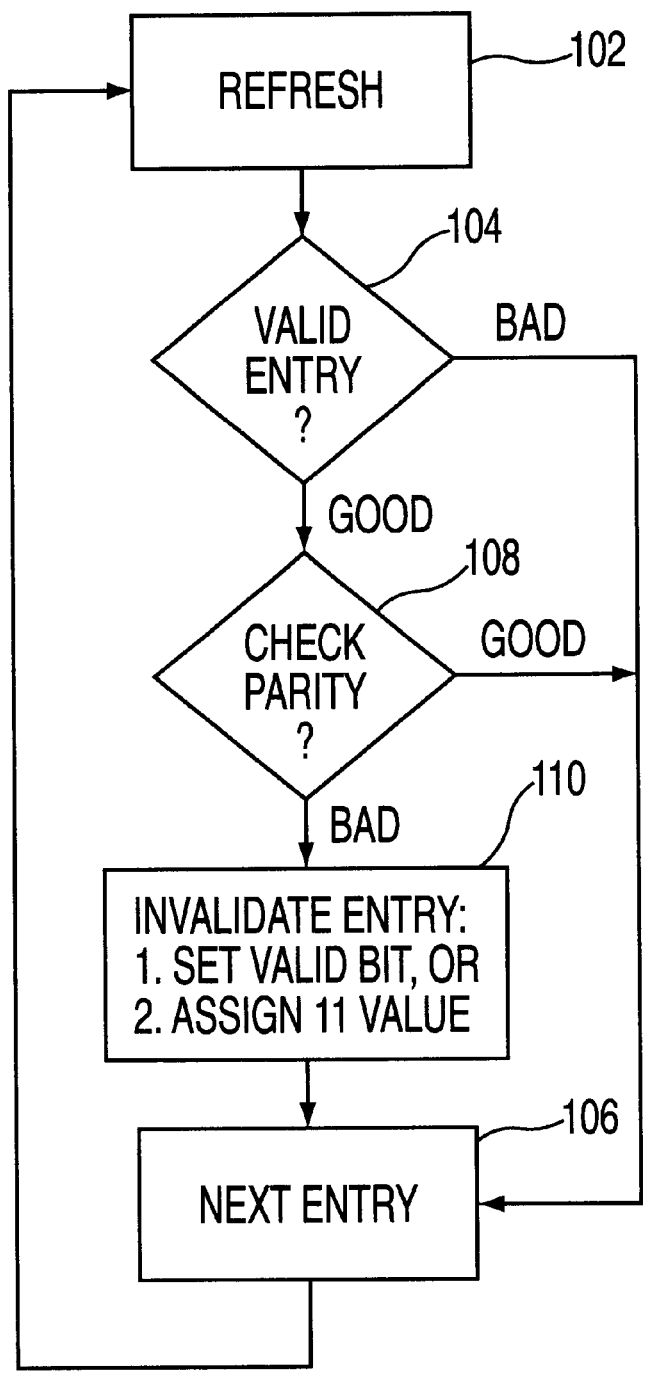
FIG. 2(a) is a flowchart illustrating a method for combining a refresh operation with a parity validation for a DRAM-based CAM, in accordance with an embodiment of the invention.

Referring now to FIG. 2(a), there is shown a flowchart which illustrates a method 100 for combining a refresh operation with a parity validation for a DRAM-based CAM, in accordance with an embodiment of the invention. Method 100 begins at block 102, where a refresh operation is executed for a DRAM-based CAM device, such as the one shown in FIG. 1. During the refresh operation, a CAM word or entry is first checked to see if it contains valid data therein, as described in block 104. A CAM word (i.e., designated series of bits) contains valid data if the word cells have previously been written to during a defined period of operation, or if the data previously written thereto has not been earlier flagged as being corrupted or bad. If no valid data was originally written and stored in the subject word, or if the word data has previously been invalidated, then the entry is not interrogated for good parity and method 100 proceeds to block 106 where another CAM entry is checked upon a subsequent refresh. In so doing, no time is wasted by checking the parity of already invalid data.

However, if the CAM entry is determined to be valid, then method 100 proceeds to block 108 where a parity validation is then performed. The details of implementing a parity validation check are well known to those skilled in the art, and are not discussed at great length hereinafter. Additional information regarding parity bit generation and checking are discussed in U.S. Pat. No. 6,067,656 to Rusu, et al., the contents of which are incorporated herein by reference. Generally speaking, the data is read from the CAM cells and inputted into a parity generator that typically includes an exclusive OR logic tree. The output of the parity generator is compared with a previously stored parity bit which (if no soft errors have occurred) should match the generated parity bit.

If the parity is found to be good upon the checking portion, then method 100 proceeds to block 106. On the other hand, if the parity is bad, then method 100 alternatively proceeds to block 110. At block 110, the data in the CAM is invalidated (by either setting a separate "data valid bit" or by setting a particular ternary CAM cell to a "11" state), since the parity mismatch is indicative of bad data. As will be explained in further detail later, the specific manner by which the bad CAM data is invalidated depends upon whether the CAM cell is of a binary design (e.g., FIG. 1) or a ternary design. Finally, even if bad parity is detected and the entry is thereafter invalidated in some manner, method 100 will then eventually proceed to block 106 for further parity checking upon a subsequent refresh cycle.

Figure 2B:
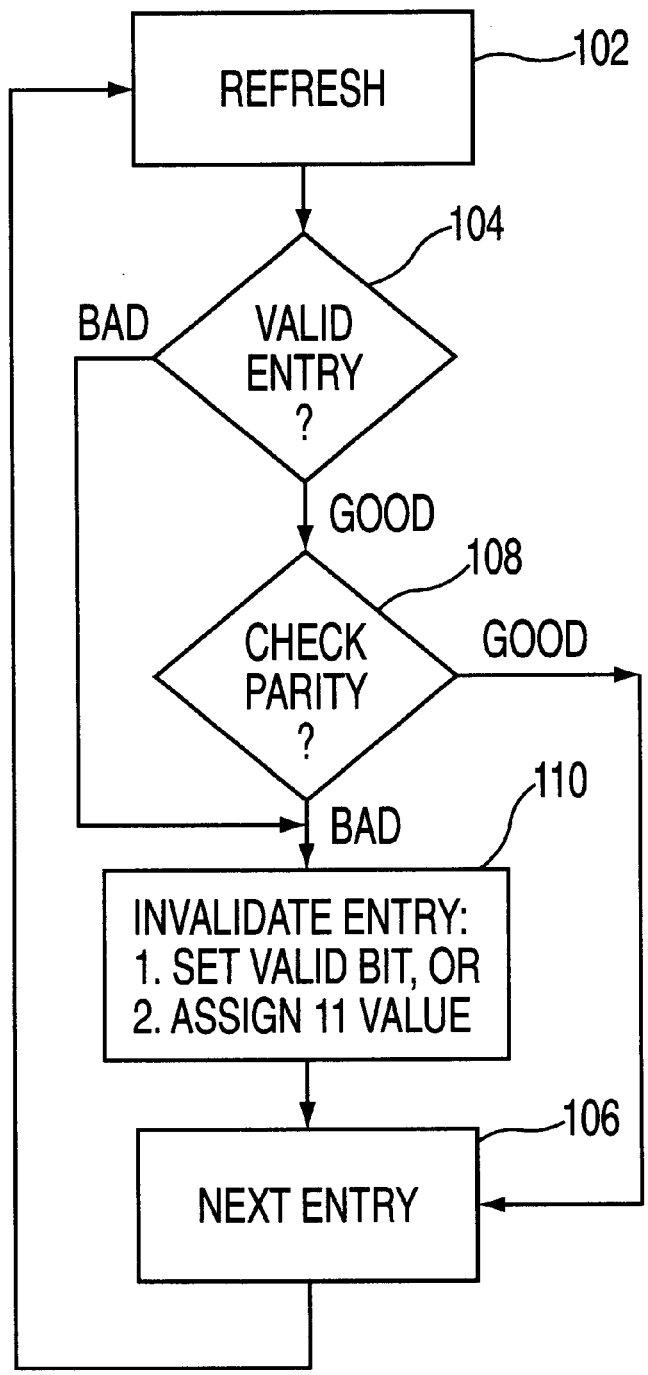
FIG. 2(b) is an alternative embodiment of the flowchart of FIG. 2(a)

FIG. 2(b) is another embodiment of method 100, wherein, if at block 104 no valid data was originally written and stored in the subject word (or if the word data has previously been invalidated), then method 100 may alternatively proceed to block 110 for invalidation of the entry before proceeding to the next entry at block 106.

With regard to the invalidation of CAM entry data at block 110, the type of CAM cell design is first considered. For example, the DRAM-based CAM of FIG. 1 is considered a binary CAM cell because it has one storage element therein ($C_1$) capable of storing either a "logic 1" state or a "logic 0" state. The masking capabilities of binary CAM cells are limited in that they can only be globally masked, since they cannot store a third state of information therein. As such, a separate storage element (for each word) is contemplated by method 100 for storage of a "data valid" bit. The storage cells for containing the data valid bit for a given word may be incorporated into a separate column and be controlled by separate logic. However, a DRAM-based data valid bit will still be refreshed even if the data word itself is already invalid.

Given that any invalidation of CAM data (block 110) occurs during a refresh cycle, the time taken to complete this operation is of concern. Thus, a data valid bit used for a binary CAM design could be stored in an SRAM CAM cell, even though the actual data bits are stored in DRAM-based CAM cells. By using an SRAM device to store the data valid bit, the overall cycle time of the memory array is reduced, as it takes less time to write a data bit to an SRAM cell than to a DRAM cell.

Figure 3:
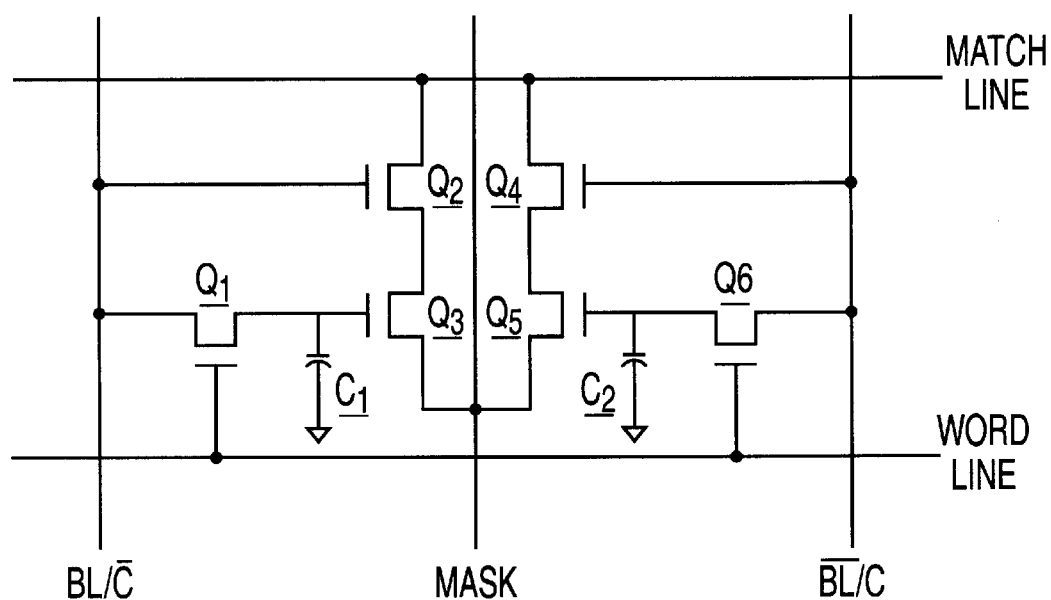
FIG. 3 is a schematic diagram of another existing DRAM-based, CAM cell of ternary design which may be used in conjunction with the method described in FIG. 2.

In contrast, a ternary-based CAM cell design allows the storage of three states of information. In addition to a "logic 1" state or a "logic 0" state, the ternary cell also provides for a "don't care" state which creates a bit-by-bit masking capability. That is, with a ternary CAM design, there is increased flexibility for a user to determine which bits in a given word will be masked during a compare operation. An example of an existing ternary CAM cell 20 is shown in FIG. 3. This cell, also referred to as a Differential Dynamic CAM ($D^2CAM$) cell, is further described in U.S. Pat. No. 5,949,696.

It is readily apparent that the ternary $D^2CAM$ cell 20 differs from the binary DCAM cell of FIG. 1, in that there are two storage capacitors $C_1$, $C_2$ and two access transistors $Q_1$, $Q_6$ in the cell 20. By using two storage elements to represent a logic state of a single bit of data, a "don't care" state may also be stored in cell 20. In the embodiment depicted, the $D^2CAM$ storage function may by accomplished differentially by storing a charge on one storage capacitor and discharging the other. For example, a "logic 1" state in cell 20 may be represented by a "1" on $C_1$ and a "0" on $C_2$. Conversely, a "logic 0" state may be represented by the differential condition of a "0" on $C_1$ and a "1" on $C_2$.

It is also apparent that there are two possible additional states which may exist in $D^2CAM$ cell 20. That is, the charge on $C_1$ equals the charge on $C_2$ ("00" and "11"). By storing a "0" or a "1" on both $C_1$ and $C_2$ simultaneously, therefore, a local "mask" state may be stored within the cell. This state allows an individual cell to be masked by causing the mask line coupled therewith set to high. In a preferred embodiment by Threewitt, this mask state is indicated by "00" on storage elements $C_1$ and $C_2$.

Thus, it will be further appreciated that by having two storage capacitors in the CAM cell, a fourth state of information exists (corresponding to "11", if the mask (don't care) state is chosen to be "00"). This fourth state is also referred to as a "forced mismatch" state in ternary designs and is now used by method 100 to denote an invalid data (bad parity) condition. Moreover, this invalid data condition can be stored in one of the existing CAM data cells without having to add a separate storage cell, as is the case with a binary CAM design. It will be noted, however, that although an additional CAM data cell is not needed to store the invalid data condition, the particular cell so used will be unable to be globally masked.

As can be seen from the above described embodiments, an efficient method has been disclosed which allows parity checking and validation operations to be efficiently performed during the DRAM refresh cycle. Depending upon the nature of the CAM cell design (binary vs. ternary), a data valid/invalid condition is determined and stored, responsive to the parity check. In this manner, words already having invalid data therein will go unchecked, thereby saving valuable time.

While the invention has been described with reference to a preferred embodiment, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A method for combining a refresh operation with a parity validation for a DRAM-based content addressable memory (CAM), the method comprising:
   implementing the memory refresh operation;
   examining a word included within the CAM;
   determining whether data contained within said word constitutes valid data;
   if said data contained within said word does not constitute valid data, then bypassing the parity validation;
   if said data contained within said word does constitute valid data, then implementing the parity validation, the parity validation further comprising;
   reading said data contained within said word;
   generating a parity bit from said data contained within said word; and
   comparing said generated parity bit with a previously stored parity bit; and
   if the parity validation is implemented and if said generated parity bit does not match said previously stored parity bit, then invalidating said data contained within said word.

2. The method of claim 1, wherein the DRAM-based content addressable memory (CAM) is of a binary configuration.

3. The method of claim 2, wherein said invalidating said data contained within said word further comprises:
   setting a data valid bit to a data invalid state, said data valid bit associated with said word.

4. The method of claim 3, wherein said data valid bit is implemented within a DRAM storage cell, said DRAM storage cell being in addition to data storage cells used to store said data.

5. The method of claim 3, wherein said data valid bit is implemented within an SRAM storage cell, said SRAM storage cell being in addition to data storage cells used to store said data.

6. The method of claim 1, wherein the DRAM-based content addressable memory (CAM) is of a ternary configuration.

7. The method of claim 6, wherein said invalidating said data contained within said word further comprises setting one of a plurality of data storage cells used to store said data to a forced mismatch state.

8. The method of claim 7, wherein:
   each of said plurality of data storage cells contains a first storage element and a second storage element therein;
   said first and second storage elements together capable of storing a pair of differential charge values with respect to one another, and said first and second storage elements further capable of storing a pair of identical charge values with respect to one another, wherein:
   one of said pair of differential charge values represents a logic 1 state;
   the other of said pair of differential charge values represents a logic 0 state;
   one of said pair of identical charge values representing a mask state; and
   the other of said pair of identical charge values representing said forced data mismatch state.

9. The method of claim 8, wherein:
   a high charge value (1) on said first storage element and a low charge value (0) on said second storage element represents said logic 1 state;
   a low charge value on said first storage element and a high charge value on said second storage element represents said logic 0 state;
   a low charge value on both of said first and second storage elements represents said mask state; and
   a high charge value on both of said first and second storage elements represents said forced data mismatch state.

10. The method of claim 1, wherein said determining whether data contained within said word constitutes valid data further comprises:
   determining whether said data contained in said word has been previously written therein during a defined period of operation, wherein if said data contained in said word has not been written therein during said defined period of operation, then said data contained in said word does not constitute valid data; and if said data contained in said word has been written therein during said defined period of operation, then determining whether said data contained in said word has been previously invalidated during a previous parity check.

11. A method for combining a refresh operation with a parity validation for a DRAM-based content addressable memory (CAM), the method comprising:

implementing the memory refresh operation;

examining a word included within the CAM;

determining whether data contained within said word constitutes valid data;

if said data contained within said word does not constitute valid data, then invalidating said data contained within said word;

if said data contained within said word does constitute valid data, then implementing the parity validation, the parity validation further comprising;
reading said data contained within said word;
generating a parity bit from said data contained within said word; and
comparing said generated parity bit with a previously stored parity bit; and if the parity validation is implemented and if said generated parity bit does not match said previously stored parity bit, then invalidating said data contained within said word.

12. The method of claim 11, wherein the DRAM-based content addressable memory (CAM) is of a binary configuration.

13. The method of claim 12, wherein said invalidating said data contained within said word further comprises:
setting a data valid bit to a data invalid state, said data valid bit associated with said word.

14. The method of claim 13, wherein said data valid bit is implemented within a DRAM storage cell, said DRAM storage cell being in addition to data storage cells used to store said data.

15. The method of claim 13, wherein said data valid bit is implemented within an SRAM storage cell, said SRAM storage cell being in addition to data storage cells used to store said data.

16. The method of claim 11, wherein the DRAM-based content addressable memory (CAM) is of a ternary configuration.

17. The method of claim 16, wherein said invalidating said data contained within said word further comprises setting one of a plurality of data storage cells used to store said data to a forced mismatch state.

18. The method of claim 17, wherein:
each of said plurality of data storage cells contains a first storage element and a second storage element therein;
said first and second storage elements together capable of storing a pair of differential charge values with respect to one another, and said first and second storage elements further capable of storing a pair of identical charge values with respect to one another, wherein:
one of said pair of differential charge values represents a logic 1 state;
the other of said pair of differential charge values represents a logic 0 state;
one of said pair of identical charge values representing a mask state; and
the other of said pair of identical charge values representing said forced data mismatch state.

19. The method of claim 18, wherein:
a high charge value (1) on said first storage element and a low charge value (0) on said second storage element represents said logic 1 state;
a low charge value on said first storage element and a high charge value on said second storage element represents said logic 0 state;
a low charge value on both of said first and second storage elements represents said mask state; and
a high charge value on both of said first and second storage elements represents said forced data mismatch state.

20. The method of claim 11, wherein said determining whether data contained within said word constitutes valid data further comprises:
determining whether said data contained in said word has been previously written therein during a defined period of operation, wherein if said data contained in said word has not been written therein during said defined period of operation, then said data contained in said word does not constitute valid data; and
if said data contained in said word has been written therein during said defined period of operation, then determining whether said data contained in said word has been previously invalidated during a previous parity check.

\* \* \* \* \*